United States Patent [19]

Sandhu

[11] 4,196,010
[45] Apr. 1, 1980

[54] COLOR FILTER ARRAYS AND COLOR IMAGING DEVICES

[75] Inventor: Mohammad A. Sandhu, Webster, N.Y.

[73] Assignee: Eastman Kodak Company, Rochester, N.Y.

[21] Appl. No.: 913,150

[22] Filed: Jun. 6, 1978

[51] Int. Cl.² ............... G03F 5/00; G02B 5/18; G02B 5/22
[52] U.S. Cl. ........................... 430/7; 313/371; 313/374; 350/162 SF; 350/311; 350/317; 358/41; 358/44; 358/253; 430/24; 430/541; 430/321
[58] Field of Search ............... 96/35, 36, 38.2, 117, 96/118, 77, 36.1, 115 R; 8/2.5 A; 313/65–68, 36, 371–374; 350/166, 162 SF, 317, 311; 427/248 H; 358/41, 44, 253

[56] References Cited

U.S. PATENT DOCUMENTS

| 2,681,857 | 6/1954 | Rogers | 96/118 |
|---|---|---|---|
| 2,750,524 | 6/1956 | Braham | 96/116 |
| 3,632,291 | 1/1972 | De Fago et al. | 8/2.5 |
| 3,940,246 | 2/1976 | De Fago et al. | 8/2.5 |
| 4,081,277 | 3/1978 | Brault | 96/38.2 |
| 4,097,230 | 1/1978 | Sandhu | 8/2.5 A |

*Primary Examiner*—Edward C. Kimlin
*Attorney, Agent, or Firm*—J. Jeffrey Hawley

[57] ABSTRACT

An improved color filter array comprises a transparent heat-transfer dye-receiving layer containing an array of filter elements wherein the dye-receiving layer is a certain polyester wherein at least 30 mole percent of the recurring units contain a saturated gem-bivalent radical having a saturated polycyclic three-dimensional structure that includes a saturated bicyclic atomic bridge hydrocarbon ring member. The improved dye-receiving layers provide filter elements with excellent edge sharpness. The improved color filter arrays are useful in color imaging devices, such as solid-state video cameras.

15 Claims, 11 Drawing Figures

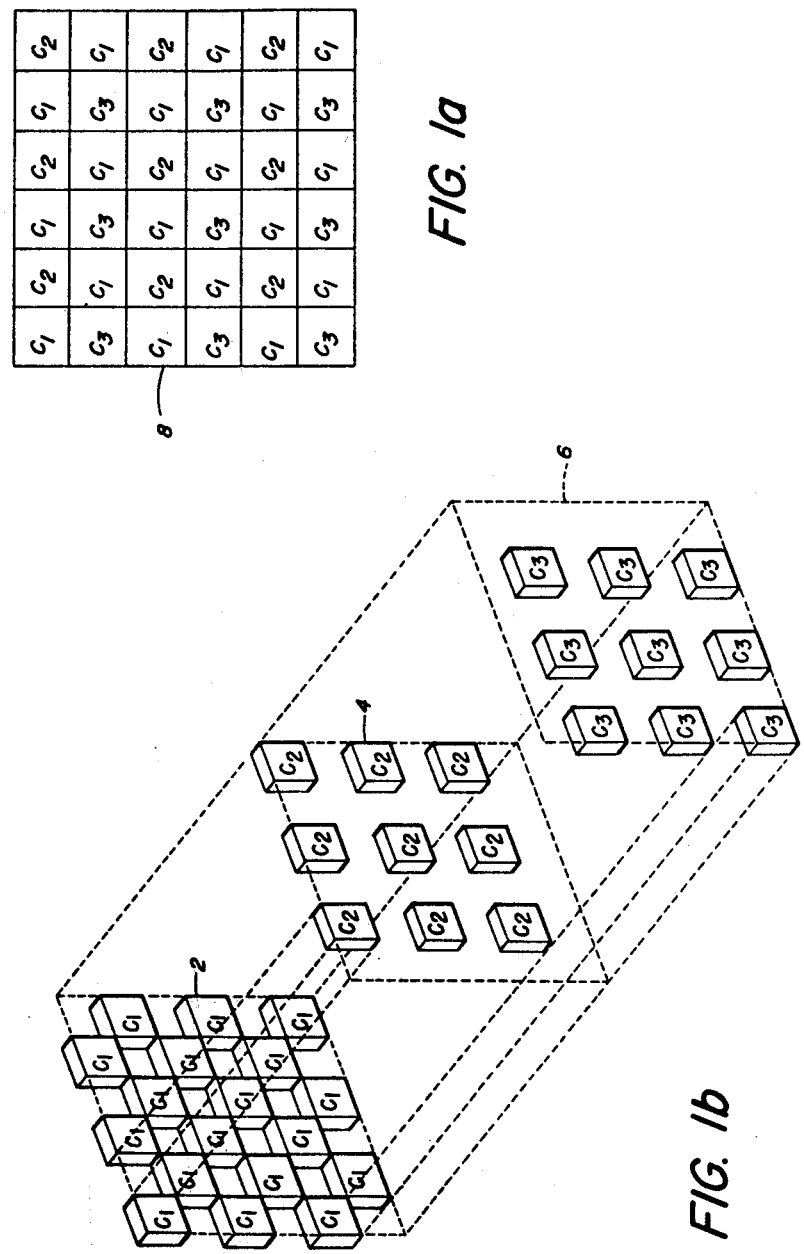

AFTER COATING RECEIVING LAYER

AFTER COATING RESIST

AFTER EXPOSURE

AFTER DEVELOPING

AFTER DYE INHIBITION

AFTER STRIPPING RESIST

COLOR FILTER ARRAYS AND COLOR IMAGING DEVICES

BACKGROUND OF THE INVENTION

1. Field of the Invention

This invention relates to color filter arrays and color imaging devices. More particularly, it relates to solid-state photosensitive devices that have a planar array of charge-handling semiconductor photosensors in microregistration in at least one dimension with a multicolor planar array of filter elements, and to methods for making them. The solid-state color imaging devices are particularly useful for solid-state video cameras.

2. Description Relative to the Prior Art

A reliable, yet sensitive all solid-state video camera would find abundant utility, including use in television cameras, card readers, facsimile recorders, picturephones, character recognition, etc. Solid-state video cameras would be desirable because, in addition to the problems inherent in traditional video cameras of drift, misalignment and short tube life, such traditional, i.e., non-solid-state, video cameras suffer from the complications of registering separate electron beams and the effects of electron beam lag. A relatively simple, efficient solid-state color camera which would overcome these problems is still sought.

Color photosensitive devices using charge-handling solid-state image sensors of various types, for example, charge-coupled devices, known as CCDs, and charge-coupled imagers, known as CCIs, have been proposed and used in video cameras. To avoid optical complexity and problems with image registration, it is highly desirable that color image sensing occur at a single imaging site, e.g., at a single planar photosensitive array. Many problems are encountered with such "single-site" color imaging, however, because at least three distinct types of color information must be extracted in order to represent a color image in video signal form.

Some of the problems associated with "single-site" color imaging processes are overcome by the approach taken in U.S. Pat. No. 3,971,065, issued July 20, 1976 in the name of B. E. Bayer. In the Bayer approach, color imaging is effected by a single imaging array composed of a large number of individual luminance and chrominance sensing elements that are distributed according to type (sensitivity) in repeating interlaid patterns, wherein the luminance pattern exhibits the highest frequency of occurrence—and therefore the highest frequency of image sampling—irrespective of direction across the array.

To produce an element array according to the Bayer approach or other similar approaches, a solid-state sensor array wherein each sensor has a broad wavelength sensitivity is provided with a superposed color filter array. Methods for providing filter arrays for various purposes are known in the art; however, many of these methods are not adaptable for producing color filter arrays which are useful with a solid-state photosensor array. For example, multilayer color filter arrays that resort to the use of multiple layers are not desirable for single-site color imaging devices, because such arrays require the imaging optics to have a large depth of field so that all layers, as well as the photosensor, are in focus. Further, multilayer arrays can result in misalignment between the individual filter elements and the underlying photosensors.

The present invention provides a method for making a color filter array, preferably having a single layer, using a heat-transfer process to diffuse dyes into a receiving layer capable of receiving dyes. The present invention is an improvement over the heat-transfer process of my coworkers Brault, Light and Martin, described in their commonly assigned, copending application Ser. No. 730,886, filed Oct. 8, 1976, now U.S. Pat. No. 4,081,277, entitled "A Method for Making a Solid-State Color Imaging Device Having an Integral Color Filter and the Device". While their invention provides a simple and effective method for providing color filter arrays for the array of charge-handling semiconductive photosensors, further improvements were sought. More specifically, further improvements in the edge sharpness of the dye deposits are desirable.

SUMMARY OF THE INVENTION

The present invention provides an improved color filter array and an improved dyed color imaging device containing the filter array. The filter array comprises a transparent polymeric layer which contains at least one heat-transferred dye.

The improvement according to the present invention involves the transparent polymeric layer. Exceptionally good results, e.g., exceptional edge sharpness of the boundaries of the filter elements, are obtained when the polymeric layer comprises an amorphous, solvent-soluble, aromatic polyester having recurring units derived from the condensation residue of a diol and a carbonic acid or a dicarboxylic acid, at least 30 mole percent of the recurring units containing a saturated gem-bivalent radical having a saturated polycyclic three-dimensional structure that includes a saturated bicyclic atomic bridge hydrocarbon ring member.

Thus, in one aspect of the present invention, I provide a color filter array comprising a transparent polymeric layer containing a planar array of filter elements, wherein said polymeric layer comprises the described gem-bivalent radical-containing polymer.

In another aspect of the present invention, I provide an improved color imaging device comprising:

(i) a radiation-sensitive surface, preferably a planar array of charge-handling semiconductive photosensors, and superimposed thereon, (ii) the described improved color filter array.

I have also discovered an improved method for making the color filter arrays of the type described above containing the transparent, polymeric receiving layer. The improved method comprises the steps of:

A. coating a layer of photoresist over the dye-receiving layer;

B. exposing the photoresist to a pattern representing a set of filter elements;

C. developing the photoresist to obtain window areas in the photoresist layer corresponding to the pattern;

D. diffusing the heat-transferable dye into the dye-receiving layer through the window areas to form dyed filter elements corresponding to the pattern; and E. removing the remaining portions of the photoresist to yield a first set of dyed filter elements in a planar array in the receiving layer.

Preferably, steps (A) through (E) are performed at least twice to form two sets of dyed filter elements in the receiving layer in an interlaid pattern, each repetition of the steps (A) through (E) yielding an additional set of dyed filter elements in an interlaid pattern with the prior sets.

In still another aspect of this invention, I provide an improved method of making a color imaging device. The method comprises the steps of (1) producing the described improved color filter array, and (2) superimposing the array onto a radiation-sensitive surface. Where the radiation-sensitive surface is a planar array of charge-handling semiconductive photosensors, the color filter array is in micro-registration in at least one dimension with the planar array of photosensors. The color imaging device can, for example, be made by coating the described receiving layer on the array of photosensors and then heat-transferring dyes to form the filter elements. In this embodiment, micro-registration can be accomplished during the photoresist exposing steps. Alternatively, the color filter array can be made by forming the filter elements in a film comprising a heat-transfer dye-receiving layer, the film subsequently being superimposed in micro-registration with the photosensor array.

The method for making the color filter array of the invention can provide filter elements having very sharply defined edges. Edge sharpness of the filter elements is important in obtaining good color reproduction in an imaging device using the array. By using the improved heat-transfer dye-receiving layer of the present invention, filter elements having an edge sharpness less than about 4 microns are easily attainable. Another advantage of the color filter arrays and method of the present invention is that arrays having high filter element densities are possible while, at the same time, the dye-receiving layer can be very thin. This helps avoid depth of field problems when the color filter arrays are used with a photosensor array in video cameras.

BRIEF DESCRIPTION OF THE DRAWINGS

FIG. 1A is a pictorial representation of a multicolor filter array formed in accord with a preferred embodiment of the invention.

FIG. 1B is an exploded pictorial representation corresponding to the array depicted in FIG. 1A;

DETAILED DESCRIPTION OF THE INVENTION

Figures 2A, 2B:
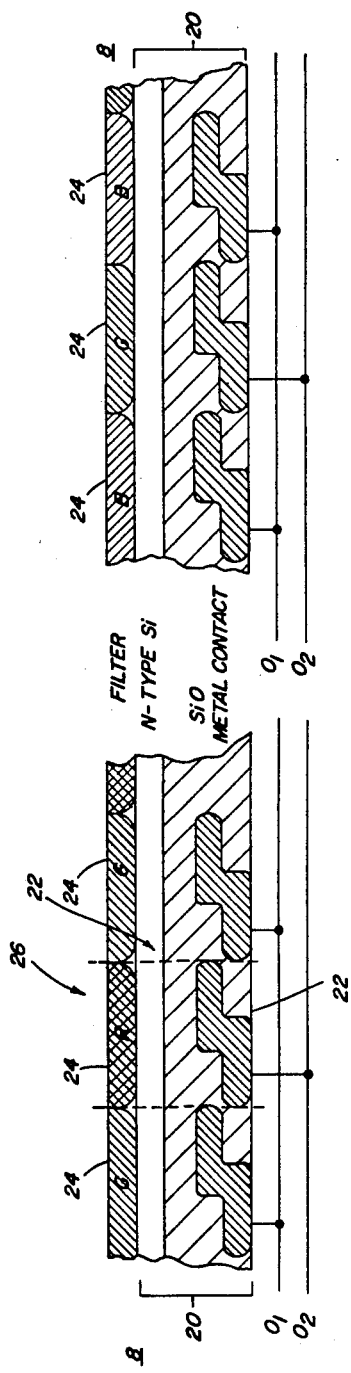
FIG. 2A is a cross-sectional representation, in part, of a row of sensing elements of a color imaging device having a planar filter array formed in accordance with the present invention.
FIG. 2B is a cross-sectional representation, in part, of a row of sensing elements adjacent the row represented in FIG. 2A.

The polymers which form the improved heat-transfer dye-receiving layer are selected from a class of amorphous, solvent-soluble, aromatic polyesters comprising recurring units derived from the condensation residue of a diol and a carbonic acid or a dicarboxylic acid, at least 30 mole percent of the recurring units containing a saturated gem-bivalent radical having a saturated polycyclic three-dimensional structure that includes a saturated bicyclic atomic bridge hydrocarbon ring member. These polyesters are described in my copending U.S. Pat. No. Application Ser. No. 730,884, filed Oct. 8, 1976, now U.S. Pat. No. 4,097,230, entitled "Improved Method for Transferring Heat Transferable Dyes". Examples of such polyesters and their preparation are described in U.S. Pat. No. 3,317,446, issued May 2, 1967 to Caldwell et al, the disclosure of which is hereby incorporated by reference.

Particularly useful polyesters of this class are those having a $T_g$ of at least about 200° C.

These polyesters have recurring units comprised of the condensation residue of an aromatic diol having the general formula:

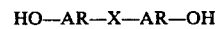

HO—AR—X—AR—OH                I or the condensation residue of an aromatic dicarboxylic acid having the general formula:

HOOC—AR—X—AR—COOH        II wherein AR is an aromatic radical and X is a saturated gem-bivalent radical having a saturated polycyclic three-dimensional structure that includes a saturated bicyclic atomic bridge hydrocarbon ring member.

Typical of some three-dimensional polycyclic structures that provide a gem-bivalent radical is the norbornane ring. The conventional method of drawing this ring is as follows:

An approximate representation which shows the three-dimensional structure of the ring is as follows:

With the gem-bivalent connecting radical, the single carbon atom to which, for example, the two aromatic nuclei of an aromatic diol or dicarboxylic acid are connected can be a carbon within the polycyclic structure, or it can be a

group attached to the polycyclic structure. For example, in 4,4'-(2-norbornylidene)diphenol, the phenolic groups are attached directly to a carbon atom within the polycyclic structure:

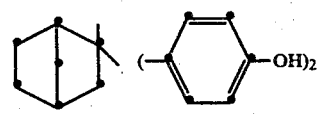

In 4,4'-(2-norbornylmethylene)diphenol, a methylidyne group attached to the polycyclic structure carries the phenolic groups:

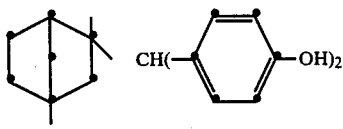

There can be additional saturated rings in the polycyclic structure in addition to the bicyclic member which contains the atomic bridge. These can be joined by fused or spiro-union linkages in the polycyclic structure.

Atomic bridges can also occur in the additional member rings of the polycyclic structure. There can be alkyl, halogen, or aromatic substituents in the linking radical.

The atomic bridge within the polycyclic structure can have more than one carbon atom, e.g., (bicyclo[2.2.2]-octane)

There can be more than one bridge in the polycyclic structure: e.g., (tricyclo[2.2.1.0$^{2,6}$]heptane)

(adamantane)

The atomic bridge can consist of an oxygen or nitrogen atom instead of carbon: e.g., (7-oxabicyclo[2.2.1]-heptane)

There can be alkyl, aryl and halide substituents on the polycyclic structure: e.g., (substituted norbornane)

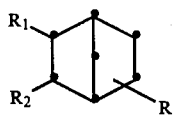

R, R$_1$ and R$_2$ can independently be hydrogen, halogen, alkyl (C$_1$–C$_4$), or aryl. Also, two substituents may be attached to the same carbon atom. Of course, all of these substituents must be in positions which do not interfere with formation of the diol or dicarboxylic acid. For example, because of steric effects, certain bisphenols cannot be obtained, e.g., those from some norbornane derivatives with two alkyl or halogen substituents in the 3- or 7-positions.

Additional saturated rings can be fused to the bicyclic bridged ring member in the polycyclic structure. These can be hydrocarbon or heterocyclic rings, e.g., (hexahydro-4,7-methanoindan)

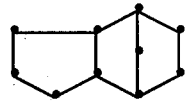

(octahydro-4,7-methanoisobenzofuran)

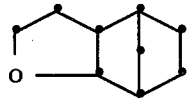

There can be additional bridges in the fused rings, e.g., (decahydro-1,4,5,8-dimethanonaphalene)

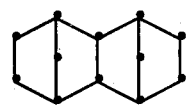

(dodecahydro-4,9,5,8-dimethano-1-cyclopenta(b)naphthalene)

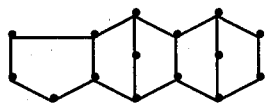

Additional saturated rings can be joined in the polycyclic structure by spiro-union linkages, e.g., (spiro[cyclopropane-1,7'-norbornane])

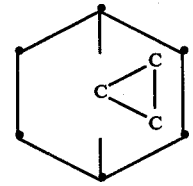

Any aromatic radical can be used in the diols and dicarboxylic acids described by the general formula I or II above, as long as they do not cause steric interference with their formation. Thus, both substituted and unsubstituted aromatic radicals are useful. A particularly useful aromatic radical is the phenyl radical which preferably has one of the following formulas:

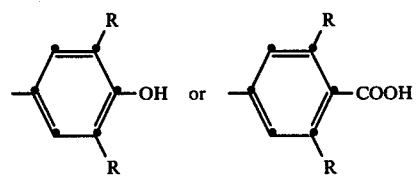

wherein each R is selected independently from hydrogen, halogen and alkyl, preferably having from 1 to about 4 carbon atoms. Additional saturated or unsaturated rings can be fused to the benzene ring, and the functional hydroxy or carboxy group can be attached at any convenient position.

When at least 30 percent of the recurring units of a polyester useful in this invention contain the condensation residue of carbonic acid or dicarboxylic acid and a diol comprising a saturated gem-bivalent linking radical X as defined above, the remaining recurring units preferably are derived from reaction of a carbonic acid or a dicarboxylic acid with a diol that comprises bisphenol having the following structure:

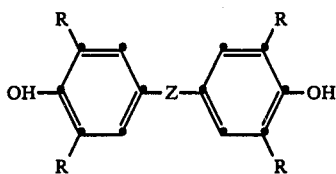

wherein R is the same as defined above and Z is selected from a sulfonyl group; an alkylidene group, preferably isopropylidene; or a cycloalkylidene group such as, for example, cyclopentylidene, cyclohexylidene, 2-norbornylidene, 9-fluorenylidene, 2(5H)-benzo[c]furanon-5-ylidene and the like.

In other preferred polyesters, when the diol comprises an aromatic group containing the gem-bivalent connecting radical X as described above, at least about 30 mole percent of the acid component of the polyester is terephthalic acid, isophthalic acid, or a mixture thereof. The remainder of the acid component, up to 70 mole percent, is selected from carbonic acid or other dicarboxylic acids. Preferred such dicarboxylic acid groups are, for example, 4,4'-sulfonylbisbenzoate; 1,2,3,4-tetrahydro-2,6-naphthalenedicarboxylate; 4,4'-isopropylidenebisbenzoate; 2,6-naphthalenedicarboxylate; and 1,1,3-trimethyl-3-phenylindan-5,4'-dicarboxylate.

Particularly useful polyesters representative of this class include: poly[4,4'-isopropylidenediphenylene-co-4,4'-hexahydro-4,7-methanoindan-5-ylidenediphenylene (50:50 mole ratio) terephthalate-co-isophthalate (50:50 molar ratio)]; poly(4,4'-hexahydro-4,7-methanoindan-5-ylidenediphenylene terephthalate); poly[4,4'-(2-norbornylidene)diphenylene carbonate]; and poly(4,4'-hexahydro-4,7-methanoindan-5-ylidenediphenylene carbonate).

The filter elements of the color filter arrays described herein contain heat-transferable dyes. By this it is meant that the dyes are heat-transferable into the polyester. Once diffused into the polyester, however, the dyes need not remain heat-transferable and, in fact, it is preferred that they remain fixed in the layer over a wide range of temperatures.

Various classes of dyes including, for example, azo, anthraquinone, indophenol, indoaniline, perinone, quinophthalone, acridine, xanthrone, diazine and oxazine dyes can be diffused into the improved receiving layers described above. A partial list of such dyes useful for making color imaging devices of the present invention include, for example:

Eastman Fast Yellow 8GLF
Eastman Brilliant Red FFBL
Eastman Blue GBN
Eastman Polyester Orange 2RL
Eastman Polyester Yellow GLW
Eastman Polyester Dark Orange RL
Eastman Polyester Pink RL
Eastman Polyester Yellow 5GLS
Eastman Polyester Red 2G
Eastman Polyester Blue GP
Eastman Polyester Blue RL
Eastone Yellow R-GFD
Eastone Red B
Eastone Red R
Eastone Yellow 6GN
Eastone Orange 2R
Eastone Orange 3R
Eastone Orange GRN
Eastman Red 901
Eastman Polyester Blue 4RL
Eastman Polyester Red B-LSW
Eastman Turquoise 4G
Eastman Polyester Blue BN-LSW (all available from Eastman Kodak Company, Rochester, N.Y.).

Color imaging devices of this invention can have color filter arrays comprising an interlaid pattern of at least two sets of filter elements, one set having a common radiation absorption and transmission characteristic different from the other set. Thus, the photosensors underlying one set of filter elements will respond to radiation from the same region of the spectrum, and photosensors underlying the other set of filter elements will respond to light from a different region of the spectrum.

The color imaging devices of the present invention are formed by superimposing the color filter array with a radiation-sensitive surface. Generally, it is desirable to have the filter means contiguous with the radiation-sensitive surface. However, in certain embodiments, where the color filter array is formed on a thin transparent layer of a support, the color filter array can be separated from the radiation-sensitive surface by the thin layer when it is superimposed on the radiation-sensitive surface. In other words, the thin support can be considered an integral part of the color filter array in such embodiments. It is preferred to superimpose the color filter array on the radiation-sensitive surface with the color filter array closest to the radiation-sensitive surface and the transparent support on the outer side of the sandwich. Any of the well-known transparent supports used in the photographic arts can be used in this embodiment.

The preferred radiation-sensitive surface, over which the described improved color filter arrays are superimposed, are arrays of solid-state photosensors, as described below. Other useful radiation-sensitive surfaces include, for example, a layer of silver halide. Examples of color imaging devices using a color filter array over a silver layer are described in U.S. Pat. Nos. 2,030,163; 1,477,880 and 3,709,693. Another useful radiation-sensitive surface is an array of phosphors, such as is used in a color cathode ray tube, examples of which are described in U.S. Pat. Nos. 3,884,695 and 4,019,905.

The solid-state photosensors useful in this invention are charge-handling image sensors, examples of which include, for instance, charge-coupled devices (also known as charge-coupled imagers, charge-transfer devices, charge-transfer imagers, etc.), charge-injection devices, bucket brigade devices, diode arrays, combinations of these and the like. Useful photosensor arrays are described, for example, in U.S. Pat. No. 3,801,884, and in "Charge-Coupled Technology Leads to Compact Video Cameras" by A. H. Watson, Bell Laboratories Record, October 1973, page 266.

The color filter array is in micro-registration in at least one dimension with the underlying array of photosensors. As used herein, the term "micro-registration"

means that the filter array and the photosensor array are precisely aligned on a micron scale. In other words, the position of the filter array is less than 1 micron away from its intended position with respect to the photosensor array and further, that each filter element is less than 1 micron away from its intended position in the filter array. A single filter element may be superimposed over one photosensor or a group of photosensors.

The filter elements of the color filter arrays of the present invention have very sharply defined edges. Therefore, the dyes in two adjacent filter elements can have little or no overlap. The term "edge sharpness" as used herein is the distance between maximum absorption and minimum absorption at the boundary of a dye deposit and can be measured by taking a micro-densitometer trace across the dye deposit boundary using known methods. The edge sharpness of the dye deposits of the present invention is less than about 4 microns, and in preferred embodiments less than about 2 microns.

The importance of micro-registration and edge sharpness for the filter elements, i.e., the ability (made possible by the present invention) to make arrays of filter elements with the respective dyed elements being confined to desired positions and dimensions, is readily apparent when one considers the very small size of the sensing areas of the photosensors in a useful solid-state color imaging device and, thus, the correspondingly small size of the superposed filter elements. A color imaging device having suitable resolution consists of an array of over 10,000 photosensors in an area 3 by 5 mm (see "Charge-Coupling Improves Its Image, Challenging Video Camera Tubes" by Tompsett et al, at pages 166 to 167 of Electronics, Jan. 18, 1973, pages 162 through 169). Useful color imaging devices of this invention can have filter elements and photosensors having areas with at least one dimension that is less than about 100 microns, preferably having areas of a size less than about $10^{-4}$ square centimeter, and even more preferably having areas less than about $2.5 \times 10^{-5}$ square centimeter. In an especially preferred embodiment, each filter element and photosensor will be rectangular in shape and have dimensions of about 30 to 40 microns. Sensing areas in this preferred embodiment can be separated by guard bands approximately 4 microns or less in width. Thus, sharp edge definition of filter elements and micro-registration of the color filter array with the underlying photosensor array are important. In some embodiments of this invention, it may be desirable that the dyed areas of adjacent filter elements overlap by up to about 4 microns, i.e., approximately the size of the guard bands between adjacent photosensors.

The color filter arrays specifically described immediately below can contain filter elements having a rectangular shape so as to conform to a common solid-state photosensor array. However, the invention is not limited to forming elements having a rectangular shape. Any shape can be conveniently formed, such as stripes, circular or triangular elements and the like. The present invention is adaptable to any application where high quality filter elements are needed.

An example of a three-color filter having a planar array of filter elements is illustrated in FIGS. 1A and 1B. Three sets of filter elements 2, 4 and 6 form an interlaid pattern to provide the three-color filter array 8. Each set of filter elements 2, 4 and 6 has a common light absorption and transmission characteristic which is different from each other set. In a preferred color imaging device of the invention, the color filter array 8 is superposed in micro-registration with an array of photosensors (not shown), so that each individual filter element C is superposed with an individual photosensor. As a result of this arrangement, an image can be sampled for all three color vectors by selecting appropriate dyes for use in the three sets of color patterns 2, 4 and 6 of the filter 8.

As illustrated by FIGS. 2A and 2B, a preferred color imaging device of the present invention employs a solid-state imaging array 20 comprised of individual charge-coupled photosensors (e.g., photosensor 22 extending between the dashed lines of FIG. 2A). A color filter array 8, wherein the $C_1$, $C_2$ and $C_3$ of FIGS. 1A and 1B are now G, R and B is superimposed on the imaging array 20. The color filter array 8 includes individual filter elements 24 which are aligned one-to-one with individual photosensors (e.g., photosensor 22) of the imaging array 20 to form a color imaging device of the invention. Individual filter elements 24 of the color filter array 8 are arranged in patterns as described above with reference to FIGS. 1A and 1B. The letters G, R and B on individual filter areas 24 serve to indicate selective green, red and blue light transmission characteristics of the individual filter elements, as would be employed in accordance with the presently preferred embodiment of a solid-state color imaging device of the invention. A preferred color imaging device of the invention comprises an array of color imaging elements 26, each comprising an individual filter element 24 combined with an individual photosensor such as photosensor 22, the combination being selectively sensitive to a particular region of the spectrum.

Figure 3:
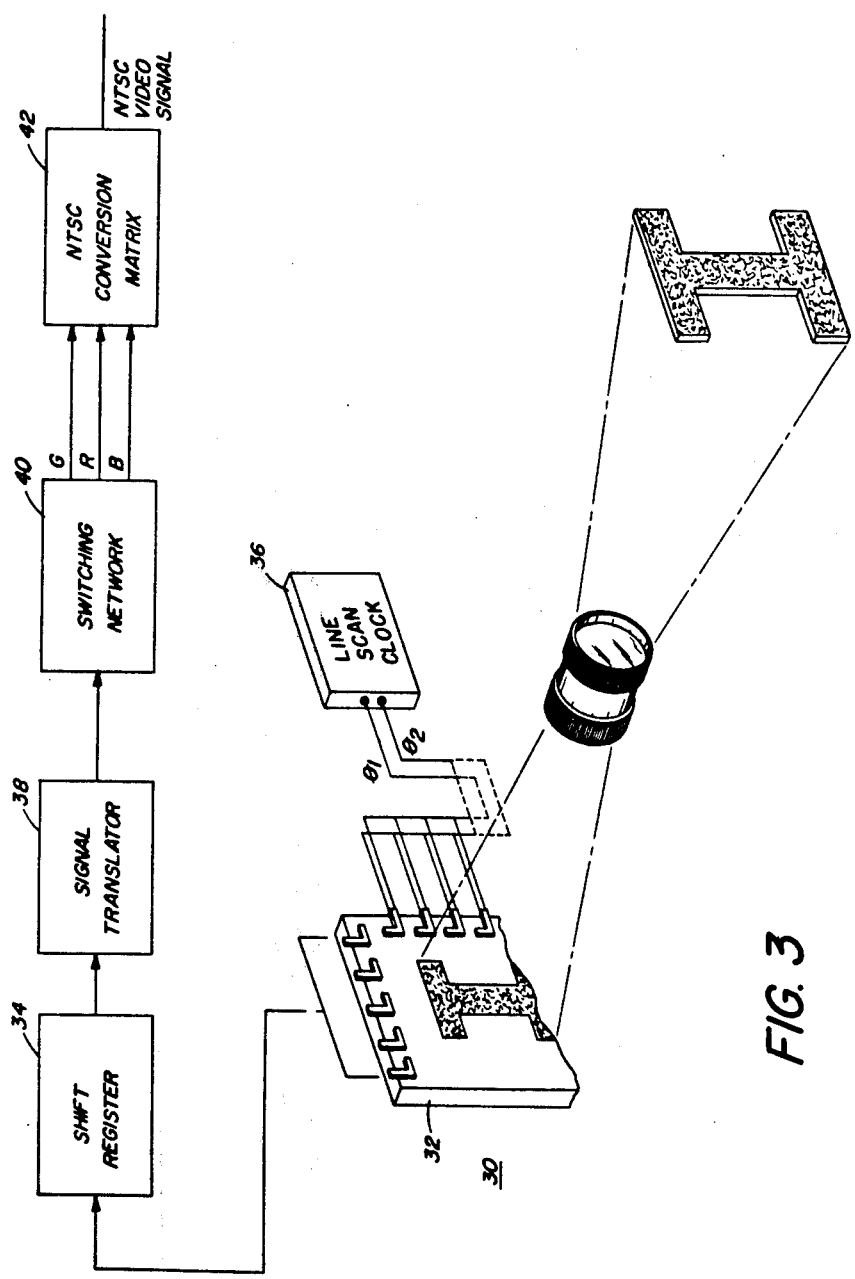
FIG. 3 is a perspective representation showing a basic arrangement of elements for a camera system using a color imaging device according to the invention.

Referring to FIG. 3, a color imaging device 30 according to the invention is shown in a simplified camera environment. Image information from individual rows of photosensors, such as a row 32, is transferred to a shift register 34 (generally formed "on board" the imaging chip) in response to signals from an interrogating apparatus, such as a line scan clock 36. Apparatus for performing this operation is well known and is described in literature and patents relating to charge-handling devices, such as CCD and CID arrays. It is also generally known to process the output signal of the register by means of a circuit 38. Using color filter arrays according to the preferred embodiments of the invention, however, information for the various base color vectors is interspersed as a result of the intermixed sensitivities of the color array elements. Accordingly, a switching network 40 is provided to separate the image signal sequence to a usable form, for example, to parallel green, red and blue video signals.

In such form, the signals are conveniently converted to NTSC format using a conversion matrix 42. This is especially convenient if the number of rows in the array corresponds to the number of visible lines in the field scan (approximately 250) or the number of visible lines in a frame (approximately 500) comprised of interlaced fields.

Referring now to FIG. 4, the color filter array 8 is made by diffusing heat-transferable dyes into a dye-receiving layer in desired patterns. In a preferred embodiment, the filter is formed by coating the heat-transfer dye-receiving layer on a semiconductive photosensor support, as illustrated by FIG. 4A. Generally, it is desirable to passivate the semiconductive support by applying a layer of silicon dioxide prior to coating the dye-receiving layer. It may also be desirable to apply a layer of subbing prior to coating the dye-receiving layer in order to promote adhesion of the receiving layer to the substrate. A suitable subbing layer is described in U.S. Pat. No. 3,271,345.

In forming the dye-receiving layer on a semiconductive support, such as an array of solid-state photosensors, it has been found desirable to heat the coated wafer at a temperature and for a period of time sufficient to remove substantially all of the solvent used in coating. The particular temperature and length of time should be selected based on the materials used. For example, heating at 200° C. for two hours has been found satisfactory when using poly(4,4'-hexahydro-4,7-methanoindan-5-ylidenediphenylene terephthalate) as the heat-transfer dye-receiving layer. Heating the dye receiver has been found to improve the effectiveness of the photoresist.

After the dye-receiving layer has been heated to remove solvent, a layer of photoresist is coated over the dye-receiving layer, as illustrated in FIG. 2B. The resist prevents dye from diffusing into the dye-receiving layer in areas protected by the resist. Thus, the photoresist layer must be a barrier to the diffusion of dye under the conditions of transfer. Gelatin-based photoresists have been found satisfactory for this purpose. An example of a useful resist is KOPR-TOP photoresist, available from Chemco Photoproducts, Inc.

Figure 4A:
FIGS. 4A through 4F depict a sequence of steps in a preferred method for forming one set of color elements in the filter array in accord with the invention.
Figure 4B:
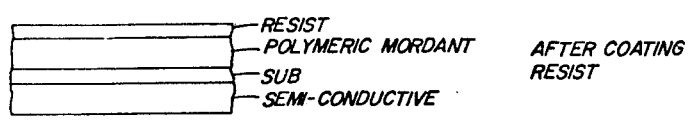
Figure 4C:
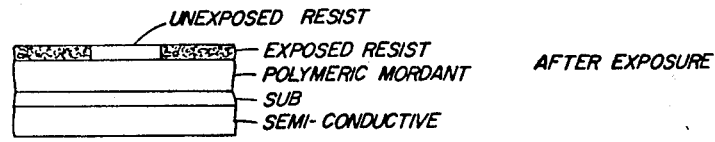
Figure 4D:
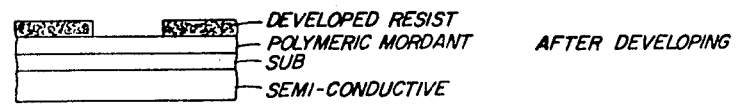

The resist layer is exposed (FIG. 4C) using a mask representing a desired filter element pattern, for example, pattern 2 of FIG. 1A. The resist layer is then developed by conventional methods, leaving window areas in the resist in the desired pattern (FIG. 4D).

Figure 4E:
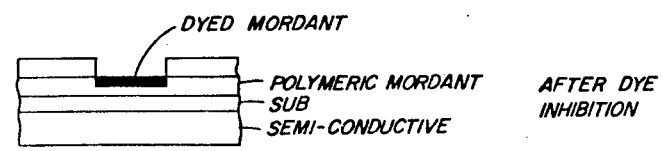

Next, heat-transferable dye is heated so as to transfer and diffuse the dye into the dye-receiving layer through the window areas provided in the resist (FIG. 4E). One method for accomplishing this transfer is to first coat a solution of the heat-transferable dye on a carrier support. In some cases, it has been found desirable to coat the dye on the support, along with a binder such as cellulose acetate. This has been found to improve the uniformity of the dye layer on the carrier support and, in turn, the uniformity of the set of dyed filter elements. A paper support can be used, although other materials, such as those generally used in the art of heat-transfer printing, can also be used. The carrier is then placed with its dye-coated side in contact with the developed resist layer. The temperature of the resulting laminate is then raised, such as by contact with a heated block, to the transfer temperature, i.e., a temperature at which the dye has sufficient vapor pressure so that dye vapors can diffuse from its carrier support and into the dye-receiving layer at a practical rate. Generally, if the desired amount of dye can be transferred into the receiving layer in from about 5 to about 120 seconds, and preferably in about 20 to about 60 seconds, the rate of transfer is satisfactory. Considerably slower rates of transfer can be used, however, as long as the length of time required for production can be tolerated.

It is also contemplated that the dye transfer can be carried out by mixing a dye with a thermal solvent (or solid solvent). Thermal solvents are any materials that are solid at room temperature, but molten at elevated temperatures, and capable of dissolving the heat-transferable dye. This mixture of a dye and thermal solvent allows the dye to be heat transferred at a lower temperature than when using the dye without the thermal solvent.

Examples of thermal solvents useful for practicing this invention include, but are not limited to, aromatic hydrocarbons, such as naphthalene and its derivatives, diphenyl and its derivatives, stilbene, durene and phenanthrene; phenols, such as 2,3-dimethylphenol, 2,5-dimethylphenol, 3,4-dimethylphenol, 3,5-dimethylphenol, 2,4,6-trimethylphenol, 2,4,5-trimethylphenol, 3,4,5-trimethylphenol, catechol, resorcin, homocatechol, pyrogallol, α-naphthol and β-naphthol; aromatic amines such as α-naphthylamine and triphenylamine, carboxylic acids such as o-toluic acid, m-toluic acid, malonic acid, glutaric acid, pimelic acid, azelaic acid and maleic acid; sulfonic acids such as benzene-sulfonic acid, p-toluene-sulfonic acid, naphthalene-β-sulfonic acid and naphthalene-α-sulfonic acid; fatty acids such as beef tallow, stearic acid, and palmitic acid and metal salts of these fatty acids; anionic, cationic, non-ionic and amphoteric surfactants; sugars such as fructose; and polyethylene glycol and chlorinated paraffin. Particularly useful thermal solvents include, for example, acetamide, 1,1-decanediol, succinimide, suberic acid, acenaphthene, methylanisate, benzophenone, methylstearate, methoxy-naphthalene and biphenyl.

Figure 4F:

After the dye is transferred by diffusing into the receiving layer, the remaining resist is stripped from the receiving layer by conventional methods (as illustrated by FIG. 4F). The receiving layer is left with a pattern of dyed areas corresponding to the mask used for the exposure of the photoresist. Additional patterns of dyed areas can be formed in the dye-receiving layer by repeating the above steps (2B through 2F), using a fresh layer of photoresist, a different exposure mask and a different dye. If the above-described process is performed three times, using a red, a blue and a green dye, each transferred in a different pattern, a three-color filter 8, as shown in FIG. 1, having an interlaid pattern of red, blue and green dye-containing areas is produced. In general, it is preferred that the dyes be transferred in an order such that the dye having the highest transfer temperature is transferred first, and the dye having the lowest transfer temperature is transferred last. This has been found to further improve edge sharpness.

In a preferred embodiment of this invention, multicolor filter arrays are made by transferring heat-transferable dyes into the dye-receiving layer at a temperature below the $T_g$ of the polymer comprising the receiving layer. Under these conditions, extremely sharp edges, e.g., less than 2 microns, for the dyed filter areas can be achieved.

Preferred color imaging devices of this invention are those having filter elements that selectively transmit green, red and blue light. These devices can also be made using subtractive primary dyes—i.e., yellow, magenta and cyan dyes. In any given filter element, an appropriate combination of two of these subtractive dyes would be present to provide a green, red or blue filter. The above-described procedure for making the color filter would then require that two dyes be diffused into the dye-receiving layer to form a set of filter elements during each masking-exposure sequence. Alternatively, a single subtractive primary dye can be diffused into the dye-receiving layer for two of the three sets of filter layer during each masking-exposure sequence. Two additional sequences would complete the three-color filter. Obviously, various combinations of these procedures can be used, depending upon the characteristics of the dyes which are being used.

The invention has been described in detail with respect to color filter arrays having three sets of filter elements. The color filter arrays described herein, however, need only contain a single set of filter elements.

The improved solid-state color imaging devices of the present invention can take a wide variety of forms. Variations can be made in the statistical and spacial relationship of the color filter elements; the relationship between the number of photosensors and the number of filter elements; the degree of overlap of the filter elements and the guard bands—to mention but a few. These variations are well known in the art. Similarly, the environment in which the improved solid-state color imaging devices described herein are useful is well known in the art, and need not be discussed in detail. For a more detailed discussion of some of these variations, reference is made to U.S. Pat. Nos. 3,971,065; 8,982,274; 4,054,906 and 4,054,915; and Research Disclosure 15916, July, 1977.

The following examples are provided to further illustrate the invention:

EXAMPLE 1

I. Preparation of Dye Carrier Paper 2 g of Eastman Brilliant Red FFBL (a dye available from the Eastman Kodak Company, Rochester, New York) were dissolved in 100 ml of dichloromethane by stirring the dye in the solvent with a magnetic stirrer for 2 hours at room temperature. The resulting solution of dye in solvent was hand coated at about 150 microns wet thickness on Baryta paper. (Baryta paper is paper coated with a layer of $BaSO_4$, commonly used in the photographic arts.) The coating of dye was air dried overnight at room temperature.

II. Preparation of a Dyed Poly(ethylene terephthalate) Control

A crosslinkable gelatin photoresist was prepared by mixing 27.6 ml (27.6 g) of KOPR-TOP Enamel with 3 ml (3.45 g) of KOPR-TOP Sensitizer (both available from Chemco Photoproducts, Inc.). A square of unsubbed poly(ethylene terephthalate) (Estar), about 5 cm on a side, was spin-coated with the crosslinkable gelatin solution using a Headway Research spin-coater at 200 rpm for 50 seconds. The gel-coated sample of Estar was exposed through a Qualitron neutral density mask for 4 minutes using a 100-watt tungsten lamp placed about 1 foot from the sample. The exposed sample was developed by rinsing with water at room temperature for approximately 20 seconds to provide window areas through the photoresist. The developed sample was air dried by spinning on the spin-coater for 50 seconds. After drying, the gel-coated Estar was placed in contact with a 5-cm square of the dye carrier paper described above (coated side against coated side) and heated at 170° C. on a heating block for 30 seconds. Upon heating, the dye sublimed from the paper through the window areas and into the Estar.

As measured on a microdensitometer, the dye deposits in the Estar can have an edge sharpness of about 4 to 10 microns. Dye density was found to be about 1.6.

III. Preparation of a Three-Color Filter Array Using the Improved Dye-Receiving Layer A 5-cm square sample of poly[4,4'-isopropylidenediphenylene-co-4,4-hexahydro-4,7-methanoindan-5-ylidenediphenylene (50:50 molar ratio) terephthalate-co-isophthalate (50:50 molar ratio) (called TIGG herein) film was spin-coated with crosslinkable gelatin, exposed, developed and dried. Eastman Brilliant Red RRBL was transferred at 170° C. for 30 seconds as in II. After dye transfer, the crosslinked gel areas on the TIGG were removed by rinsing with water and squeegeeing.

The sample was recoated with crosslinkable gelatin, exposed (using a different mask), developed and dried. Eastman Blue GBN coated on Baryta paper was transferred at 160° C. for 30 seconds. After dye transfer, the crosslinked gel areas were again removed.

The TIGG was coated for a third time with crosslinkable gelatin, exposed (using a third mask), developed and dried. A green dye made by dissolving 1 g of Eastman Blue GBN and 1 g of Eastman Fast Yellow 8 GLF in 100 ml of dichloromethane and coated on Baryta paper was transferred at 155° C. for 40 seconds. After dye transfer, the crosslinked gel was removed.

The resulting three-color filter array was then viewed microscopically using transmitted light and a magnification of 50×. An excellent quality three-color filter array was observed with image areas having dimensions of 30 microns by 40 microns. Cross-sectional photomicrographs of the dyed image areas made. The photomicrographs indicated that the thickness of the red areas was approximately 1.5 microns, and that the thicknesses of the blue and green areas were approximately 1 micron. A microdensitometer trace across a boundary of a dye deposit showed an edge sharpness of less than 4 microns, a significant improvement over the control dye deposits in Estar.

EXAMPLE 2

Making a Color Filter Array on a Quartz Disc Using the Improved Dye-Receiving Layer 3 g of poly(4,4'-hexahydro-4,7-methanoindan-5-ylidenediphenylene terephthalate), called VY herein, were dissolved in a mixture of 20 ml of dichloromethane and 35 ml of toluene by stirring the polymer in the solvent with a magnetic stirrer for 4 hours at room temperature. The resulting solution was spin-coated on a 25-mm diameter quartz disc coated with a subbing layer of poly(methylacrylate-co-vinylidene chloride-co-itaconic acid), a subbing layer described in U.S. Pat. No. 3,271,345. The spin-coating was prepared using 100 rpm for 50 seconds. The coating of VY polymer was dried in a laboratory oven for 4 hours at 120° C.

The dried disc was then spin-coated with crosslinkable gelatin as in Example 1. The gelatin was then exposed through a mask, developed and dried as in Example 1 to produce window areas. Eastman Brilliant Red FFBL coated on Baryta paper was transferred at 175° C. for 40 seconds through the window areas. After dye transfer, the crosslinked gel areas were removed. An excellent quality dye reproduction of the Qualitron mask pattern used was reproduced in the VY. Examination of this color filter with an interference microscope indicated that the VY layer was approximately 0.5 microns thick. The density of dyed areas to blue light was measured using a Macbeth TD-504 densitometer and found to be 2.6. Edge sharpness was 0.5 to 1 micron.

EXAMPLE 3

Use of Eastman Polyester Blue BN-LSW to Dye Receiver VY 2 g of Eastman Polyester Blue BN-LSW were dissolved in 15 ml of dichloromethane by stirring the dye in the solvent with a magnetic stirrer for 2 hours at room temperature. A 2-by-2 inch piece of copy paper was placed in the resulting dye solution and allowed to soak for approximately 3 minutes. The paper was removed from the dye solution and air dried for 1 hour.

A sample of VY film was spin-coated with crosslinkable gelatin using a Headway Research spin-coater and coating at 2,000 rpm for 50 seconds. The gel-coated sample of VY was then exposed with a 100-watt tungsten lamp through a resolving power test target. Exposure was made for 4 minutes through a test target with the lamp placed about 1 foot from the sample. The exposed sample was developed by rinsing with water at room temperature for approximately 20 seconds and dried by spinning on the spin-coater at room temperature for 50 seconds.

After drying, the gel-coated VY was placed in contact with the dye-coated paper prepared above (gel-coated side against the dye). The combination was heated (heating block in contact with paper side) at 220° C. for 30 seconds. The dye sublimed from the paper through the areas where the gelatin had dissolved away during development and into the VY.

The crosslinked gel areas on the VY were removed by rinsing the sample with water and squeegeeing.

The resulting images produced in the VY receiver were examined microscopically using transmitted light and a magnification of 50×. An excellent quality reproduction of the resolution test pattern was observed. The resolution was at least 90 lines/mm, which was the maximum of the test target.

EXAMPLE 4

Making a Three-Color Filter Array on a Quartz Disc Using the Improved Dye-Receiving Layer A layer of VY polymer was coated on a 25-mm diameter quartz disc in the same manner as described in Example 2, except that the disc was first passivated with $SiO_2$. After coating the VY with a crosslinkable gelatin, exposing and developing in the same manner as described in Example 1, the wafer was placed in contact with a carrier sheet containing the red dye, Eastman Red 901, and heated at 200° C. for 30 seconds. The remaining crosslinked gel was removed by washing for 30 minutes in a 3 M $CaCl_2$ solution at 80° C., accompanied by gentle rubbing of the surface.

A second layer of crosslinkable gelatin was coated, exposed to a second mask and developed. This time, a carrier sheet containing the blue dye, Eastman Polyester Blue 4RL, was placed in contact with the disc and heated at 200° C. for 30 seconds. The remaining crosslinked gelatin was again removed.

Then a third layer of the gelatin resist was coated, exposed to a third mask and developed. A carrier sheet containing a green dye, a mixture of Eastman Blue GBN and Eastone Yellow R-GFD, was placed in contact with the disc and heated at 180° C. for 30 seconds. The remaining resist was removed with $CaCl_2$ solution.

A quartz disc having an integral three-color filter of excellent quality comprising three patterns of filter elements with each filter element being 30-by-40 microns in size was produced. Edge sharpness of the red, green and blue filter elements was less than 4 microns.

The invention has been described in detail with particular reference to certain preferred embodiments thereof, but it will be understood that variations and modifications can be effected within the spirit and scope of the invention.

What is claimed is:

1. In a color filter array containing a planar array of filter elements which comprise a transparent, polymeric layer, at least one of said elements containing at least one heat-transferred dye in said polymeric layer, the improvement wherein:
   said polymeric layer comprises an amorphous, solvent-soluble, aromatic polyester having recurring units derived from the condensation residue of a diol and a carbonic acid or a dicarboxylic acid, at least 30 mole percent of the recurring units containing a saturated gem-bivalent radical having a saturated polycyclic three-dimensional structure that includes a saturated bicyclic atomic bridge hydrocarbon ring member.

2. The color filter array according to claim 1 wherein the edge sharpness of said filter elements is less than 4 microns.

3. The color filter array according to claim 1 wherein said polyester comprises recurring units comprised of the condensation residue of an aromatic diol having the general formula:

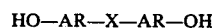

HO—AR—X—AR—OH or the condensation residue of an aromatic dicarboxylic acid having the general formula:

HOOC—AR—X—AR—COOH wherein AR is an aromatic radical and X is a saturated gem-bivalent radical having a saturated polycyclic three-dimensional structure that includes a saturated bicyclic atomic bridge hydrocarbon ring member.

4. The color filter array according to claim 3 wherein said atomic bridge contains one or more carbon atoms, an oxygen atom, a nitrogen atom or a spiro-union linkage.

5. The color filter array according to claim 3 wherein AR is represented by the formula:

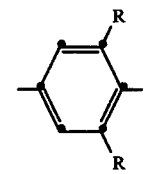

wherein each R is independently selected from hydrogen, halogen and alkyl having from 1 to about 4 carbon atoms.

6. The color filter array according to claim 1 wherein said polyester is selected from the group consisting of poly[4,4'-isopropylidenediphenylene-co-4,4'-hexahydro-4,7-methanoindan-5-ylidenediphenylene (50:50 molar ratio) terephthalate-co-isophthalate (50:50 molar ratio)]; poly(4,4'-hexahydro-4,7-methanoindan-5-ylidenediphenylene terephthalate); poly[4,4'-(2-norbornylidene)diphenylene carbonate]; and poly-(4,4'-hexahydro-4,7-methanoindan-5-ylidenediphenylene carbonate).

7. In a color imaging device comprising:
   (i) a radiation-sensitive surface and superimposed thereon,
   (ii) a color filter array comprising a transparent, polymeric layer, said layer containing a planar array of filter elements, at least some of which contain at least one heat-transferred dye that absorbs radiation in at least one portion of the spectrum and transmits radiation in at least one other portion of the spectrum, the improvement wherein:

said polymeric layer comprises an amorphous, solvent-soluble, aromatic polyester having recurring units derived from the condensation residue of a diol and a carbonic acid or a dicarboxylic acid, at least 30 mole percent of the recurring units containing a saturated gem-bivalent radical having a saturated polycyclic three-dimensional structure that includes a saturated bicyclic atomic bridge hydrocarbon ring member.

8. The color imaging device according to claim 7 wherein said radiation-sensitive surface is a planar array of charge-handling semiconductive photosensors and wherein said color filter array is in micro-registration with said array of photosensors.

9. The color imaging device according to claim 7 wherein the edge sharpness of said filter elements is less than 4 microns.

10. The color imaging device according to claim 7 wherein said polyester comprises recurring units comprised of the condensation residue of an aromatic diol having the general formula:

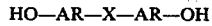

HO—AR—X—AR—OH or the condensation residue of an aromatic dicarboxylic acid having the general formula:

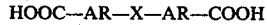

HOOC—AR—X—AR—COOH wherein AR is an aromatic radical and X is a saturated gem-bivalent radical having a saturated polycyclic three-dimensional structure that includes a saturated bicyclic atomic bridge hydrocarbon ring member.

11. The color imaging device according to claim 7 wherein said atomic bridge contains one or more carbon atoms, an oxygen atom, a nitrogen atom or a spiro-union linkage.

12. The color imaging device according to claim 10 wherein AR is represented by the formula:

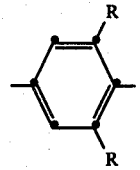

wherein each R is independently selected from hydrogen, halogen and alkyl having from 1 to about 4 carbon atoms.

13. The color imaging device according to claim 7 wherein said polyester is selected from the group consisting of poly[4,4'-isopropylidenediphenylene-co-4,4'-hexahydro-4,7-methanoindan-5-ylidenediphenylene (50:50 molar ratio) terephthalate-co-isophthalate (50:50 molar ratio)]; poly(4,4'-hexahydro-4,7-methanoindan-5-ylidenediphenylene terephthalate); poly[4,4'-(2-norbornylidene)diphenylene carbonate]; and poly(4,4'-hexahydro-4,7-methanoindan-5-ylidenediphenylene carbonate).

14. The color imaging device according to claim 7 wherein said color filter array comprises three sets of filter elements in an interlaid pattern, a first set containing a red dye, a second set containing a green dye and a third set containing a blue dye.

15. The color imaging device according to claim 8 wherein at least one of said filter elements and said photosensors have areas less than about $10^{-4}$ square centimeter.

* * * * *